Oct. 13, 1964 K. REUSCHEL 3,152,933

METHOD OF PRODUCING ELECTRONIC SEMICONDUCTOR DEVICES HAVING A MONOCRYSTALLINE BODY WITH ZONES OF RESPECTIVELY DIFFERENT CONDUCTANCE

Filed June 6, 1962 2 Sheets-Sheet 1

Oct. 13, 1964 K. REUSCHEL 3,152,933
METHOD OF PRODUCING ELECTRONIC SEMICONDUCTOR DEVICES HAVING
A MONOCRYSTALLINE BODY WITH ZONES OF RESPECTIVELY
DIFFERENT CONDUCTANCE
Filed June 6, 1962 2 Sheets-Sheet 2

United States Patent Office 3,152,933
Patented Oct. 13, 1964

3,152,933

METHOD OF PRODUCING ELECTRONIC SEMICONDUCTOR DEVICES HAVING A MONOCRYSTALLINE BODY WITH ZONES OF RESPECTIVELY DIFFERENT CONDUCTANCE

Konrad Reuschel, Pretzfeld, Upper Franconia, Germany, assignor to Siemens-Schuckertwerke Aktiengesellschaft, Berlin-Siemensstadt, Germany, a corporation of Germany Filed June 6, 1962, Ser. No. 200,526
Claims priority, application Germany June 9, 1961
6 Claims. (Cl. 148—175)

My invention concerns a method of producing electronic semiconductor devices and composite circuit components that comprise a monocrystalline body with zones of respectively different conductance types or different dopant concentrations. More particularly, my invention relates to the production of stratified semiconductors by precipitating semiconductor substance from the gaseous phase upon heated carrier crystals of semiconductor material having the same or substantially the same lattice structure as the semiconductor substance being precipitated.

Semiconductor devices of the type mentioned are employed, for example, as individual electronic components such as transistors, rectifiers or four-layer p-n junction devices, and also as parts or assemblies in microcircuitry. The above-mentioned precipitation of semiconductor substance upon heated carrier crystals is known, for example, from German Patent 865,160 and U.S. Patent 3,011,877 and described in U.S. Patent application of Schweickert, Serial No. 90,291, filed February 20, 1961, now Patent No. 3,099,534.

My present invention has for its object to further improve production methods of the above-mentioned type toward facilitating the simultaneous and more expeditious processing of a large number of individual semiconductor devices or components while securing the desired uniform electronic properties of the products.

According to my invention, a semiconductor body is subdivided by parallel incisions into a multiplicity of discs or plates, the incisions being passed almost, but not entirely, through the cross section of the semiconductor body so that the resulting plate members remain integral with each other at one location of each member. Thereafter, the subdivided semiconductor body is heated to the necessary pyrolytic or chemo-physical precipitation temperature while being subjected to a flowing reaction gas, such as a gaseous compound of the semiconductor substance to be precipitated in mixture with a carrier or reaction gas. As a result, the individual plate members, still jointly constituting a coherent rod structure, are individually coated with the precipitating semiconductor substance. After the disc members are thus coated and preferably after the rod-shaped body is permitted to cool, the plate members are completely severed from each other.

The subdivision of the original semiconductor body may be effected by passing a number of cuts parallel to each other and perpendicularly to the axis of the rod-shaped body through the major extent of the cross section, thus subdividing the rod structure into a number of plate members which, upon completion of the coating process, can be separated from one another by simply passing one or more cuts through the rod in a direction parallel to the rod axis.

The method is preferably performed by precipitating upon the crystalline carrier body a semiconductor substance consisting of the same semiconductor material, for example by precipitating germanium from the gaseous phase upon a carrier body of germanium, or by precipitating silicon upon silicon. However, the carrier crystal may also consist of semiconductor substance different from that to be precipitated from the gaseous phase. For example, when germanium is precipitated upon a carrier of silicon, the germanium coating can be contacted by electrodes or terminals at lower temperatures than required for fusing or alloying a contact to silicon, and the contacting materials may also be different from those needed for silicon. The essential conditions for such precipitation of different semiconductor substances are that the reaction temperatures for the dissociation of the semiconductor substance from the gaseous compound and for precipitation upon the carrier be lower than the melting temperature of the carrier material, and that the lattice constants of carrier crystal and precipitating semiconductor substance differ no more than about 5% from each other. Accordingly, for example, germanium can be precipitated upon silicon, gallium arsenide (GaAs) upon germanium, aluminum arsenide (AlAs) on germanium or on silicon, gallium arsenide (GaAs) upon aluminum arsenide and conversely, aluminum phosphide (AlP) on silicon, gallium phosphide (GaP) on silicon, and indium phosphide (InP) on germanium.

One substance may also merge with the other through mixed-crystals. For example, if germanium is to be precipitated upon a silicon monocrystal, the precipitation can be started, for example, by precipitating silicon from a corresponding silicon compound such as silicon tetrachloride ($SiCl_4$) or silicochloroform ($SiHCl_3$). Then a gradually increasing quantity of the corresponding germanium compound is added to the gas flow passing into the reaction chamber while correspondingly reducing the amount of silicon compound. In this manner, the process is gradually converted to precipitation of germanium only.

The precipitation of semiconductor substance from the corresponding compounds thereof, for example their halogen compounds, is preferably effected by chemical reaction, for example by reduction with hydrogen. Generally, a large excess of hydrogen is used. In this case, hydrogen also serves as carrier gas for driving the gaseous atmosphere through the reaction chamber.

The above-mentioned and more specific objects, advantages and features of my invention will be apparent from the following description in conjunction with the accompanying drawings in which.

Figure 1:
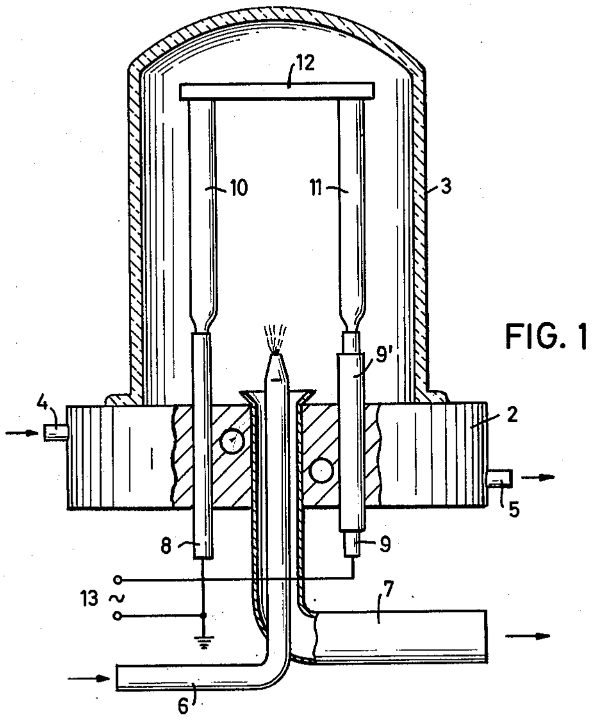
FIG. 1 shows partly in section a reaction vessel applicable for the purpose of the invention.

The reaction vessel according to FIG. 1 comprises a base portion 2 and a bell portion 3 placed upon the base and consisting, for example, of quartz. The base 2 consists of metal and is preferably provided with internal ducts traversed by a flow of liquid coolant which passes through inlet and outlet nipples 4 and 5 as indicated by arrows. The pipe located substantially on the vertical center axis of the base serves for supplying the reaction gas mixture into the processing space beneath the bell 3. The opening of pipe 6, protruding into the reaction space, is designed as a nozzle in order to produce a high-speed, turbulent flow of the gas mixture. A second pipe 7 of larger diameter serves for discharging the waste gases from the reaction space. The supply pipe 6 extends along a short distance within the exit-gas pipe 7 so that the reaction gases are preheated by heat exchange from the hot exit gases. Two current supply terminals 8 and 9 pass through the base 2. The terminal 8 may be grounded as shown and is then preferably in electric connection with the metal structure of the base 2 whereas the terminal 9 is insulated from the base by an insulating sleeve 9'. Mounted on the terminals 8 and 9 within the reaction space are respective semiconductor rods 10 and 11 so as to be in electrically conducting connection with the respective terminals. A conducting bridge member 12 interconnects the respective top ends of the two rods 10 and 11. The bridge member 12 may consist of the same semiconductor material as the rods 10 and 11 or of high-purity (spectral) graphite. An electric current source is connected outside of the reaction space with the two terminals 8 and 9 as indicated by current supply terminals 13. The current supply source is preferably controllable or regulatable with respect to the voltage impressed across the terminals 8 and 9.

Figure 2:
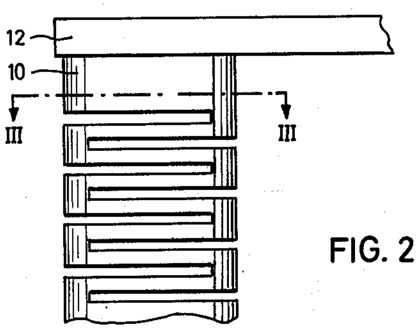
FIG. 2 shows on enlarged scale a portion of FIG. 1.

The portion illustrated in FIG. 2 constitutes the junction between the semiconductor rod 10 and the bridge member 12. The semiconductor rod 10 may be produced, for example, from a cylindrical monocrystalline rod obtained by crucible-free (floating) zone melting. The rod is subdivided by a multiplicity of parallel slits which are out into the rod alternately from opposite longitudinal sides so that the meander-shaped design according to FIG. 2 results. The rod 11 is prepared in the same manner.

Figure 3:
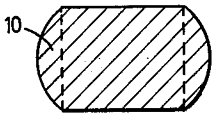
FIG. 3 is a cross section along the line III—III in FIG. 2.

The cross section of the semiconductor rod may be circular, thus corresponding to the cross section normally resulting from the zone-melted product. However, the cross section may also possess a different shape, for example the shape of a rectangle, square or hexagon. FIG. 3 shows a preferable cross section obtained, for example, by removing respective rod portions from two opposite sides by passing two cuts parallel to the rod axis along a semiconductor rod of circular cross section. The diameter of such a semiconductor rod may, for example, be 12 to 20 mm.

When passing electric current through a semiconductor rod slitted in the manner described, the middle, rectangular portion of the cross section (bordered in FIG. 3 by broken lines) is more strongly heated than the rod portions near the arcuate segmental portions because the flow cross section for the electric current is smallest in the rectangular area. Since this flow cross section and consequently the current density within the rectangular range is completely uniform, the semiconductor rod is uniformly heated in these areas. The precipitation of semiconductor therefore in these areas is likewise uniform.

The slitting of the semiconductor rod can be effected with the aid of diamond saws, for example. The resulting slits may have a width of 0.3 mm., for example. The thickness of the remaining material, that is, the thickness of the resulting individual plate members, can be determined in accordance with the minimum to be observed when using the particular sawing tool or it can be given greater thickness. The plate thickness may amount, for example, to 0.25 mm. If desired, however, the slits may be given a width up to several millimeters and the thickness of the remaining plate members may be dimensioned up to about 1 mm. The semiconductor rod provided with slits by sawing is preferably subjected to chemical etching, for example by immersion in an etching solution as generally used in semiconductor techniques, thus treating the semiconductor surface to the extent required to lay undisturbed crystal layers bare in order to make the plate members suitable for monocrystalline growth of the semiconductor substance to be precipitated thereupon. By means of such etching, the ultimate thickness of the remaining plate members may also be determined and controlled to some extent.

After completing the precipitation of semiconductor substance in the reaction chamber as described above, the semiconductor rod is separated into individual plate members either by breaking the rod-shaped body or by means of cutting. For example, two cuts can then be passed through the rod along the broken lines in FIG. 3. The resulting products are rectangular semiconductor plates whose core zone consists of the original substance of the semiconductor rod, for example silicon of p-type conductance, and which are coated on top and bottom sides with layers of precipitated semiconductor substance for example n-type silicon. Each individual member thus constitutes an n-p-n transistor. The production of p-n-p transistors proceeds analogously by employing an n-type original carrier rod and precipitating p-type substance thereupon. If the resulting plate members are to be used as rectifiers, one of the outer layers, namely an n-type layer in the embodiment first mentioned, must be subsequently removed, for example by sand-blasting, lapping or etching. Those portions or areas of the semiconductor member that are not to be subjected to attack by etching medium can be masked off for example with a varnish resistant to the etching medium such as Pizein varnish.

Figure 4:
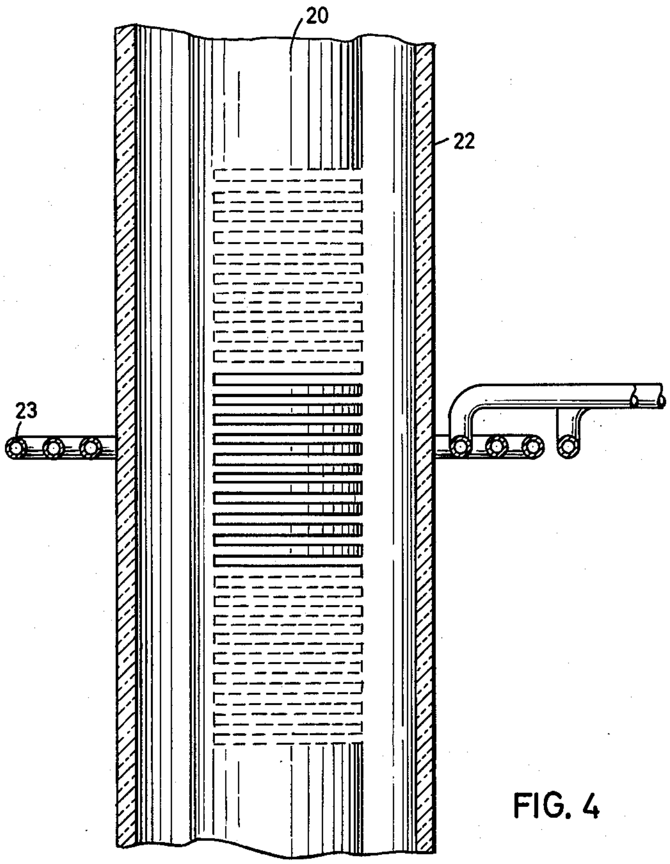
FIG. 4 shows partly in section another embodiment of processing apparatus for the purposes of the invention.

In the embodiment illustrated in FIG. 4, a semi-conductor rod 20 is provided with slots from only one longitudinal side. The rod is mounted within a relatively narrow tube 22 traversed by the gas mixture. The tube may consist of quartz, for example. The rod is not heated by directly passing electric current therethrough. The heating is rather effected by means of a high-frequency induction coil 23 which is to be connected to a high-frequency generator furnishing a voltage of 3 to 5 megacycles per second, for example. The heater coil 23 surrounds the quartz tube 22. It preferably consists of copper tubing and is traversed by liquid coolant during operation. The semiconductor rod 20 and the induction heater coil 23 are longitudinally displaceable relative to each other.

When performing the method according to the invention, a glowing zone is passed, in a manner comparable to the molten zone in the crucible-free zone-melting process, through the semiconductor rod 20. The precipitation of semiconductor substance takes place mainly at the location where the glowing zone is located at a time. According to one mode of operation, the glowing zone is passed along the semiconductor rod 20 at a speed sufficiently slow to produce the desired thickness of precipitated semiconductor material during the first pass of the zone. Another mode of operation is to produce the desired thickness of the precipitated layer by passing the glowing zone repeatedly through the semiconductor rod thus effecting the repeated precipitation of semiconductor layers, which may be of varying conductance types or intensities. Which of these modes of operation is preferable in a particular case depends upon such factors as the design of the semiconductor device or component to be produced and the particular materials employed.

Figure 5:
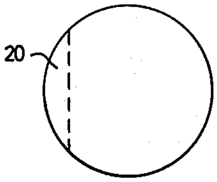
FIG. 5 shows a cross section through the rod-shaped semiconductor body illustrated in FIG. 4.

FIG. 5 shows a cross section of the semiconductor rod 20 according to FIG. 4. The ultimate severing of the plate-shaped semiconductor members can be effected, for example, by passing a single cut parallel to the rod axis along the broken line in FIG. 5. The electric or inductive heating of the semiconductor rod described above requires preheating of the semiconductor rod because the highly pure semiconductor substance of the rod is virtually insulating at normal room temperature. The preheating can be effected by heat radiation. Applicable for this purpose are arc lamps, for example. When employing a device according to FIG. 4, it is preferable to insert at a suitable location of the semiconductor rod 20, particularly at the upper or lower end of the row of slits, a disc into one of the slits, this disc consisting of metal which is immediately capable of conducting electric current. For example, at this location a broader slit may be provided and a disc of molybdenum or tungsten may be placed into the wider slit. Such molybdenum or tungsten discs are employed, for example, as carrier plates for various semiconductor devices. Also suitable for preheating purposes is an inserted disc of graphite. The inductive heating can then be started at the location of the inserted conductive disc which becomes rapidly heated and transmits its heat by conductance into the adjacent semiconductor substance of the rod so that this substance also becomes conductive. As a result, the glowing zone can readily be passed from the first-heated location through the entire processing length of the rod.

The semiconductor rod may also be provided with slits in a sloping direction relative to the rod axis in order to produce semiconductor plates of larger dimensions.

It will be understood from the foregoing that the invention is applicable not only for the production of n-p-n and p-n-p transistors and rectifiers but also for the production of any other semiconductor devices, including four-layer devices such as controlled rectifiers of thyratron performance. The precipitation of layers having respectively different conductance type can be effected successively by admixing corresponding dopant substance to the reaction gas mixture. Thus, for example, boron chloride ($BCl_3$) and phosphorus trichloride ($PCl_3$) can be added to the reaction gas mixture for the production of p-type and n-type layers respectively.

For avoiding lattice disturbances during crystal growth, it is in some cases of advantage to change for a short interval of time prior to commencing the precipitation process proper, the mole ratio of the reaction gases or/and the reaction temperature so that a slight amount of semiconductor material is carried away from the semiconductor rod, thus securing an undisturbed crystalline surface constitution which subsequently secures a monocrystalline growth of the layers being precipitated. This method is also described in the copending application Serial No. 813,583, filed May 15, 1959, of myself and others, abandoned in favor of Serial No. 281,857 of May 9, 1963, to which reference may be had for further details of design. The various methods and modifications described in that application as well as those described in the copending application Serial No. 737,254, filed May 23, 1958, of H. Gutsche, now Patent No. 3,042,494, can be used to particular advantage in combination with the present invention. If desired, the concentration of the added gaseous compound of a doping substance can be varied and thereby a continuous change in dopant concentration of the precipitated semiconductor substance be effected.

Such and other modifications will be obvious to those skilled in the art, upon a study of this disclosure and particularly in conjunction with the disclosures of the abovementioned copending applications, and are indicative of the fact that my invention can be given embodiments other than particularly illustrated and described herein, without departing from the essential features of the invention and within the scope of the claims annexed hereto.

I claim:

1. The method of producing electronic semiconductor devices having a monocrystalline body with zones of respectively different conductance type, by precipitation of semiconductor substance from the gaseous phase onto a semiconducting carrier crystal, which comprises cutting a crystalline semiconductor body by parallel incisions nearly but not fully traversing the body so as to produce a multiplicity of plate members merging with one another at one location of each; heating the subdivided but still coherent body to precipitation temperature while subjecting the body to a flow of gas containing gaseous compound of the semiconductor substance to be precipitated in mixture with gaseous reducing agent whereby a coat of said semiconductor substance is produced on said respective plate members; and completely severing the plate members from one another when so coated.

2. The method of producing electronic semiconductor devices having a monocrystalline body with zones of respectively different conductance type, by precipitation of semiconductor substance from the gaseous phase onto a semiconducting carrier crystal, which comprises cutting an elongated crystalline rod by parallel incisions perpendicular to the rod axis, said incisions nearly but not fully traversing the rod so as to produce a multiplicity of plate members merging with one another at one location of each; heating the subdivided but still coherent rod to precipitation temperature while subjecting the rod to a flow of gas containing gaseous compound of the semiconductor substance to be precipitated in mixture with gaseous reducing agent whereby a coat of said semiconductor substance is produced on said respective plate members; and completely severing the plate members from one another when so coated by cutting the rod parallel to the rod axis.

3. The method of producing electronic semiconductor devices having a monocrystalline body with zones of respectively different conductance type, by precipitation of semiconductor substance from the gaseous phase onto a semiconducting carrier crystal, which comprises cutting an elongated crystalline rod by parallel incisions perpendicular to the rod axis from the same longitudinal side and nearly but not fully traversing the rod so as to produce a comb-shaped configuration having a multiplicity of plate members merging with one another at one location of each; heating the subdivided but still coherent rod to precipitation temperature while subjecting the rod to a flow of gas containing gaseous compound of the semiconductor substance to be precipitated in mixture with gaseous reducing agent whereby a coat of said semiconductor substance is produced on said respective plate members; and completely severing the plate members from one another when so coated.

4. The method of producing electronic semiconductor devices having a monocrystalline body with zones of respectively different conductance type, by precipitation of semiconductor substance from the gaseous phase onto a semiconducting carrier crystal, which comprises alternately cutting an elongated crystalline rod by parallel incisions perpendicular to the rod axis from opposite longitudinal sides and nearly but not fully traversing the rod so as to produce a meander-shaped configuration having a multiplicity of plate members merging with one another at one location of each; heating the subdivided but still coherent rod to precipitation temperature while subjecting the rod to a flow of gas containing gaseous compound of the semiconductor substance to be precipitated in mixture with gaseous reducing agent whereby a coat of said semiconductor substance is produced on said respective plate members; and completely severing the plate members from one another when so coated.

5. The method of producing electronic semiconductor devices having a monocrystalline body with zones of respectively different conductance type, by precipitation of semiconductor substance from the gaseous phase onto a semiconducting carrier crystal, which comprises cutting a crystalline semiconductor body by parallel incisions nearly but not fully traversing the body so as to produce a multiplicity of plate members merging with one another at one location of each; inductively heating the subdivided but still coherent body to precipitation temperature while subjecting the body to a flow of gas containing gaseous compound of the semiconductor substance to be precipitated in mixture with gaseous reducing agent whereby a coat of said semiconductor substance is produced on said respective plate members; and completely severing the plate members from one another when so coated.

6. The method of producing electronic semiconductor devices having a monocrystalline body with zones of respectively different conductance type, by precipitation of semiconductor substance from the gaseous phase onto a semiconducting carrier crystal, which comprises cutting a crystalline semiconductor body by parallel incisions nearly but not fully traversing the body so as to produce a multiplicity of plate members merging with one another at one location of each; heating the subdivided but still coherent body to precipitation temperature by directly passing electric current therethrough while subjecting the body to a flow of gas containing gaseous compound of the semiconductor substance to be precipitated in mixture with gaseous reducing agent whereby a coat of said semiconductor substance is produced on said respective plate members; and completely severing the plate members from one another when so coated.

References Cited in the file of this patent

UNITED STATES PATENTS

| | | |
|---|---|---|
| 2,834,697 | Smits | May 13, 1958 |
| 2,880,117 | Hanlet | Mar. 31, 1959 |
| 3,011,877 | Schweickert et al. | Dec. 5, 1961 |
| 3,015,590 | Fuller | Jan. 2, 1962 |
| 3,042,493 | Reuschel et al. | July 3, 1962 |
| 3,042,494 | Gutsche | July 3, 1962 |
| 3,057,690 | Reuschel et al. | Oct. 9, 1962 |
| 3,085,032 | Fuller | Apr. 9, 1963 |
| 3,099,534 | Schweickert et al. | July 30, 1963 |